(12) United States Patent
Tsukuda et al.

(10) Patent No.: US 7,868,397 B2
(45) Date of Patent: Jan. 11, 2011

(54) VERTICAL SEMICONDUCTOR DEVICE

(75) Inventors: Masanori Tsukuda, Kawasaki (JP);
Ichiro Omura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/209,690

(22) Filed: Sep. 12, 2008

(65) Prior Publication Data
US 2009/0095977 A1    Apr. 16, 2009

(30) Foreign Application Priority Data
Oct. 16, 2007    (JP)    ............... 2007-268776

(51) Int. Cl.
*H01L 27/088*    (2006.01)
(52) U.S. Cl. .............. 257/401; 257/329; 257/341; 257/330; 257/492; 257/262
(58) Field of Classification Search ............... 257/401, 257/329, 341, 330, 492, 262
See application file for complete search history.

(56) References Cited

U.S. PATENT DOCUMENTS 6,407,413 B1 *    6/2002    Kawamoto ............... 257/133

7,518,197 B2 *    4/2009    Yamaguchi ............... 257/401

FOREIGN PATENT DOCUMENTS

| JP | 8-288524 | 11/1996 |
|----|----------|---------|
| JP | 2001-217420 | 8/2001 |

OTHER PUBLICATIONS

Tsuneo Ogura, et al., "A New Stored-Charge-Controlled Over-Voltage Protection Concept for Wide RBSOA in High-Voltage Trench-IEGTs" Proceedings of the 18$^{th}$ International Symposium on Power Seminconductor Devices & IC's, Jun. 4, 2008, pp. 25-28.

* cited by examiner

*Primary Examiner*—Long Pham
(74) *Attorney, Agent, or Firm*—Oblon, Spivak, McClelland, Maier & Neustadt, L.L.P.

(57) ABSTRACT

In a vertical semiconductor device including a first base layer of a first conductivity type, second base layers of a second conductivity type, emitter layer of the first conductive type and gate electrodes which are formed at one main surface of the first base layer and including a buffer layer of the first conductivity type, a collector layer of the second conductivity type and a collector electrode which are formed at the other main surface of the first base layer, an electric field relaxing structure selectively formed outside from the second base layers and the collector layer is formed expect the region below the electric field relaxing structure.

13 Claims, 2 Drawing Sheets

VERTICAL SEMICONDUCTOR DEVICE

CROSS-REFERENCE TO RELATED APPLICATIONS

This application is based upon and claims the benefit of priority from the prior Japanese Patent Application No. 2007-268776 filed on Oct. 16, 2007; the entire contents which are incorporated herein by reference.

BACKGROUND OF THE INVENTION

1. Field of the Invention

The present invention relates to a vertical semiconductor device, particular to a vertical insulated gate bipolar transistor (hereinafter, called as an "IGBT").

2. Description of the Related Art

In an IGBT as a vertical gate type semiconductor device with high voltage resistance, as of now, since the gate circuit can be easily fabricated because the gate is voltage-controlled, the IGBT can be widely available a power electronics field typified by an inverter and a switching power source. The IGBT is a power device having high speed switching characteristics of a MOSFET and high output power characteristics of a bipolar transistor.

In general, the IGBT is configured to be separated into the effective unit (chip center) and the peripheral unit (chip terminal). If the IGBT chip center has only the effective unit, the dielectric breakdown and/or the low voltage avalanche breakdown of the IGBT chip may be caused due to the increase of the surface field effect at the periphery thereof and the increase of the internal electric field thereof. In this point of view, as described above, the IGBT is separated into the effective unit functioning as the inherent IGBT (transistor) and the electric field-relaxing unit (chip terminal) with the electric field relaxing structure to relax the surface electric field as described above, thereby enhancing the voltage resistance thereof.

For example, such an attempt is made as forming, on the surface of the n-type base layer constituting the IGBT, a resurf layer with P-type impurities injected therein and dispersing the surface electric charges to develop the voltage resistance of the IGBT (Reference 1). Moreover, such an attempt is made as forming, on the surface of the n-type base layer constituting the IGBT, a plurality of guard-rings with p-type impurities therein and dispersing the surface electric charge to develop the voltage resistance of the IGBT (Reference 2).

In the IGBT with the developed voltage resistance as described above, holes injected from the collector are spread over the IGBT. In the case that the IGBT is off-state, therefore, the depletion layer formed in the n-type base layer is contacted with the n-type buffer layer located below the n-type base layer at the effective unit of the IGBT so that the voltage and current can not be stable and may be oscillated after the off-state of the IGBT. As a result, the IGBT may cause some electromagnetic noises due to the oscillation of the voltage and current and thus, may cause noise sources for other elements and other instruments connected therewith. Accordingly, the entire operation of the device including the IGBT under good condition is disturbed. What's worse, the IGBT may be broken.

In order to reduce the oscillation of the voltage and current, it is considered to increase the thickness of the n-type base layer, but in this case, the electric power loss may be increased due to the increase of the thickness of n-type base layer.

Moreover, if the intensity of the electric field depending on the carrier density stored in the IGBT becomes larger than a prescribed electric field, the low voltage avalanche may occur so as not to realize the desired voltage resistance.

[Reference 1] JP-A 8-288524 (KOKAI)
[Reference 2] JP-A 2001-217420 (KOKAI)

BRIEF SUMMARY OF THE INVENTION

An aspect of the present invention relates to a vertical semiconductor device, including: a first base layer of a first conductivity type; second base layers of a second conductivity type selectively formed at one main surface of the first base layer; emitter layers of the first conductivity type selectively formed at respective surfaces of the second base layers opposite to the first base layer; an electric field relaxing structure selectively formed at the one main surface of the first base layer outside from the second base layer; gate electrodes to be electrically connected with at least the second base layer via respective gate insulating films; an emitter electrode to be electrically connected with the second base layer and the emitter layers; a buffer layer of the first conductive type formed on the other main surface of the first base layer; a collector layer of the second conductivity type formed at a main surface of the buffer layer opposite to the base layer except a region below the electric field relaxing structure; and a collector electrode layer formed on the main surface of the buffer layer so as to be electrically connected with the collector layer.

Another aspect of the present invention relates to a vertical semiconductor device, including: a first base layer of a first conductivity type; second base layers of a second conductivity type selectively formed at one main surface of the first base layer; emitter layers of the first conductivity type selectively formed at respective surfaces of the second base layers opposite to the first base layer; an electric field relaxing structure selectively formed at the one main surface of the first base layer outside from the second base layer; gate electrodes to be electrically connected with at least the second base layer via respective gate insulating films; an emitter electrode to be electrically connected with the second base layer and the emitter layers; a buffer layer of the first conductive type formed on the other main surface of the first base layer; a collector layer of the second conductivity type formed at a main surface of the buffer layer opposite to the base layer except the electric field relaxing structure; and a collector electrode layer formed on the main surface of the buffer layer so as to be electrically connected with the collector layer, wherein the gate electrodes are divided into peripheral gate electrodes located in the side of the electric field relaxing structure and center gate electrodes located inside from the peripheral gate electrodes so that a high speed control signal is applied to the peripheral electrodes in comparison with the center gate electrodes.

Still another aspect of the present invention relates to a vertical semiconductor device, including: a first base layer of a first conductivity type; second base layers of a second conductivity type selectively formed at one main surface of the first base layer; emitter layers of the first conductivity type selectively formed at respective surfaces of the second base layers opposite to the first base layer; an electric field relaxing structure selectively formed at the one main surface of the first base layer outside from the second base layer; gate electrodes to be electrically connected with at least the second base layer via respective gate insulating films; an emitter electrode to be electrically connected with the second base layer and the emitter layers; a buffer layer of the first conductive type formed on the other main surface of the first base layer; a collector layer of the second conductivity type formed at a main surface of the buffer layer opposite to the base layer except the electric field relaxing structure; and a collector electrode layer formed on the main surface of the buffer layer so as to be electrically connected with the collector layer, wherein the gate electrodes are divided into peripheral gate electrodes located in the side of the electric field relaxing structure and center gate electrodes located inside from the peripheral gate electrodes so that a high speed control signal is applied to the peripheral electrodes in comparison with the center gate electrodes.

DETAILED DESCRIPTION OF THE INVENTION

Then, some embodiments will be described with reference to the drawings.

First Embodiment

Figure 1:
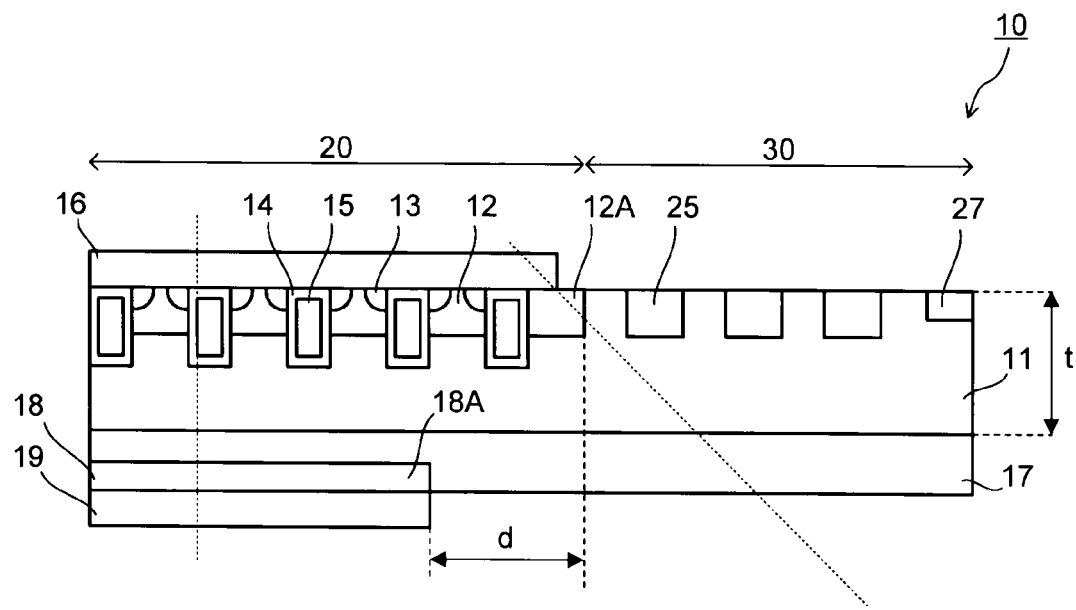
FIG. 1 is a cross sectional view schematically showing a vertical insulating gate bipolar transistor (IGBT: Insulated Gate Bipolar Transistor) according to a first embodiment.

FIG. 1 is a cross sectional view schematically showing a vertical insulating gate bipolar transistor (IGBT: Insulated Gate Bipolar Transistor) according to a first embodiment.

The IGBT 10 shown in FIG. 1 includes an n-type base layer (first conductivity type base layer) 11, p-type base layers (second conductivity type base layers) 12 selectively formed at one main surface of the n-type base layer 11, and n-type emitter layers (first conductivity type emitter layers) 13 selectively formed at the respective surfaces of the p-type base layers 12 opposite to the n-type base layer 11. Then, trenches are formed so as to reach the n-type base layer 11 through the n-type emitter layers 13 and the p-type base layers 12 so that gate insulating films 14 and the gate electrodes 15 are formed in the trenches. Then, an emitter electrode 16 is formed above the gate electrodes 15 so as to be electrically connected with the p-type base layers 12 and the n-type emitter layers 13.

Then, an n-type buffer layer (first conductivity buffer layer) 17 is formed on the other main surface of the n-type base layer 11, and a p-type collector layer (second conductivity type collector layer) 18 is formed at the surface of the n-type buffer layer 17 opposite to the n-type base layer 11. Then, a p-type collector electrode 19 is formed so as to be electrically connected with the p-type collector layer 18.

The n-type base layer 11, the p-type base layers 12, the n-type emitter layers 13, the gate electrodes 15 (and the gate insulating films 14), the emitter electrode 16, the n-type buffer layer 17, the p-type collector layer 18 and the collector electrode 19 functions an effective unit 20 to realize the inherent transistor operation of the IGBT 10. The effective unit 20 can exhibit the inherent IGBT function (e.g., flowing a main current of the IGBT) and is located at the center of the chip constituting the IGBT 10.

On the other hand, a plurality of guard rings 25 are provided at the one main surface of the n-type base layer 11 in the vicinity of the p-type base layers 12 and located outward from the p-type base layers 12. The guard rings 25 are formed by selectively injecting p-type impurities into the n-type base layer 11, for example. When the effective unit 20 of the IGBT 10 is operated (on and off) as a transistor, the guard rings 25 function as relaxing the electric field to be applied to the effective unit 20 of the IGBT 10, and thus, functions as an electric field relaxing structure.

In this embodiment, the p-type collector layer 18 and the collector electrode 19 constituting the effective unit 20 of the IGBT 10 are not formed below the guard rings 25. Therefore, the n-type base layer 11, the n-type buffer layer 17 and the guard rings 25 constitute an electric field relaxing unit 30 of the IGBT 10. The electric field relaxing unit 30 is located at the terminal of the chip constituting the IGBT 10.

An $n^+$ stopper layer 27 is formed at the outermost of the electric field relaxing unit 30 so as to prevent the electric conduction at the edge of the IGBT 10 (chip).

In this embodiment, the effective unit 20 can function as the inherent IGBT, and the p-type collector 18 and the collector electrode 19 are formed at the effective unit 20. Therefore, a relatively large amount of holes are injected into the n-type base layer 11 from the p-type collector 18 at the effective unit 20 of the IGBT 10.

In contrast, the electric field relaxing unit 30 can not exhibit the function of the IGBT and does not have the p-type collector layer 18 and the collector electrode 19. Therefore, since no hole is injected into the n-type base layer 11 from the p-type collector layer 18 at the electric field relaxing unit 30, the electric field relaxing unit 30 has an extremely small amount of carriers.

In this way, since the effective unit 20 of the IGBT 10 includes the relatively large amount of carriers, the depletion layer is formed only at the narrow area of the effective unit 20. In the electric field relaxing unit 30 of the IGBT 10, the depletion layer can not be almost formed or formed to be laterally elongated. In this embodiment, therefore, when the IGBT 10 is off-state, the voltage waveform and current waveform generated from the IGBT 10 are not oscillated because the depletion layer is not contacted with the n-type buffer layer 17. As a result, the electromagnetic noises originated from the oscillation of the voltage waveform and the current waveform can be prevented.

Moreover, since the formation area of the depletion layer is limited to a narrower area at both of the effective unit 20 and the electric field relaxing unit 30 of the IGBT 10, the thickness of the n-type base layer 11 can be reduced to 200 μm or less, for example. In the case that the IGBT 10 is switched on so that a current is flowed vertically to the emitter electrode 16 from the collector electrode 19, the electric power loss relating to the current flow can be reduced. Namely, the electric power loss at the on-state of the IGBT 10 can be reduced.

In a conventional IGBT, if the intensity of the electric field generated in the IGBT is increased more than a prescribed critical intensity of electric field, avalanche phenomenon occurs so that relatively large voltage and current remain in the IGBT after the IGBT is switched off to cause the electric power loss. In the IGBT with the electric field relaxing structure, the critical intensity of the electric field at the electric field relaxing unit becomes smaller than the critical intensity of the electric field at the effective unit. In this point of view, the avalanche phenomenon is likely to be caused at the electric field relaxing unit than at the effective unit.

In this embodiment, however, since the electric field relaxing unit 30 of the IGBT 10 has an extremely small amount of carriers, the intensity of the electric field generated at the electric field relaxing unit 30 becomes small. As a result, the intensity of the electric field generated at the electric field relaxing unit 30 is unlikely to become larger than the critical intensity of the electric field to cause the avalanche phenomenon even though the critical intensity of the electric field for the avalanche phenomenon is small. Accordingly, in the IGBT 10 of this embodiment, particularly since the avalanche phenomenon at the electric field relaxing unit 30 can be prevented effectively so that the electric power loss accompanied by the avalanche phenomenon, that is, the electric power loss at the non-conduction state of the off-state of the IGBT 10 can be prevented.

In other words, according to the IGBT 10 of this embodiment, the intended vertical semiconductor device can be provided so that the electric power loss at the conduction state of the on-state of the IGBT 10 can be prevented while the electric power loss at the non-conduction of the off-state of the IGBT 10 can be also prevented and so that the electromagnetic noises can be removed effectively.

In this embodiment, the collector electrode 19 is formed only at the effective unit 20, but may be elongated in the electric field relaxing unit 30 only if the p-type collector layer 18 is formed only at the effective unit 20. Herein, according to this embodiment, since the collector electrode 19 is formed only at the effective unit 20, the above-described function/effect can be exhibited conspicuously.

Only if the p-type collector layer 18 is formed only at the effective unit 20 of the IGBT 10, the above-described function/effect can be exhibited, but it is desired that the edge 18A of the collector layer 18 in the side of the electric field relaxing unit 30 is located inside from the edge 12A of the p-type base layer 12 in the side of the electric field relaxing unit 30 by the distance "d" more than the thickness "t" of the n-type base layer 11. In this case, the above-described function/effect can be exhibited conspicuously.

Second Embodiment

Figure 2:
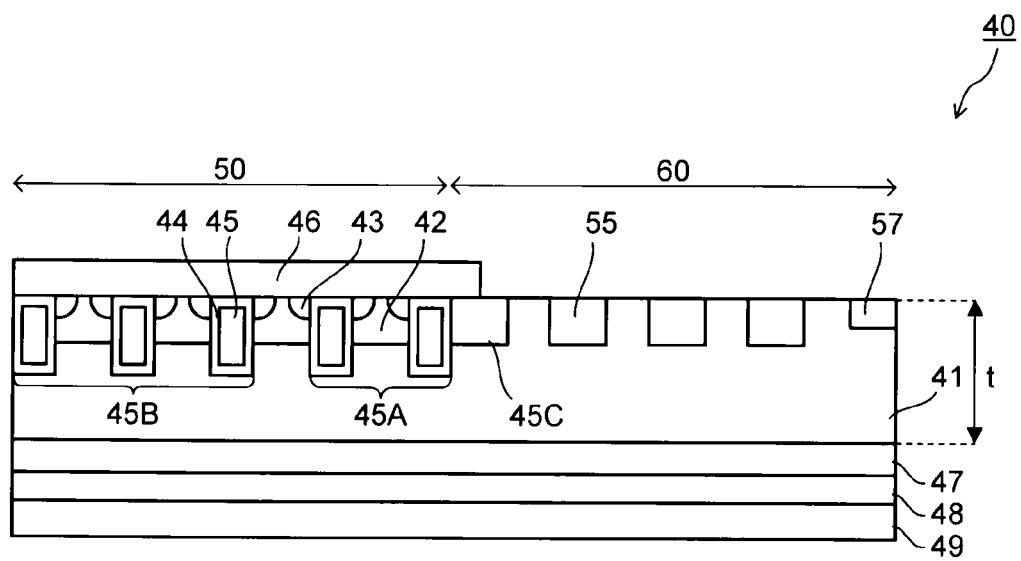
FIG. 2 is a cross sectional view schematically showing an IGBT according to a second embodiment.
Figure 3:
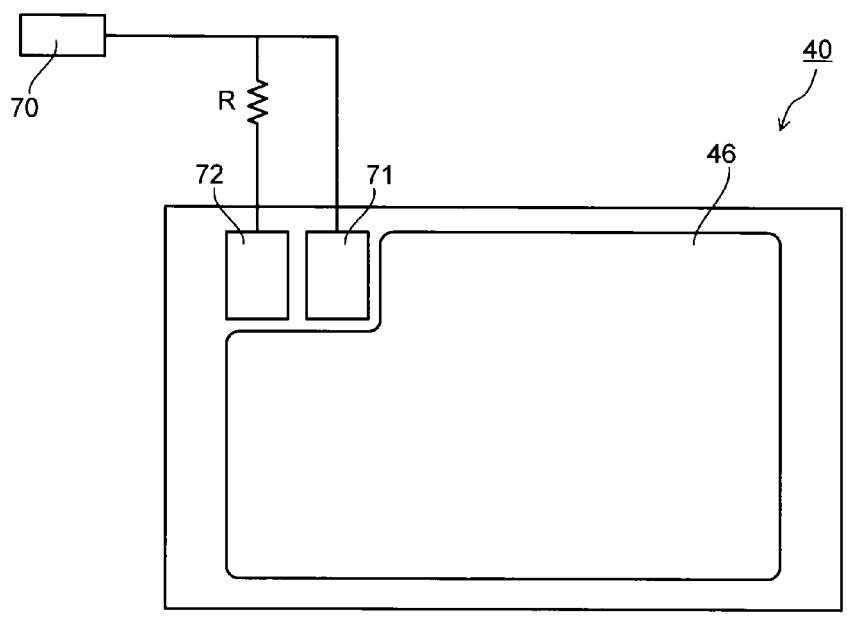
FIG. 3 is a top plan view of the IGBT shown in FIG. 2.

FIG. 2 is a cross sectional view schematically showing an IGBT (Insulated Gate Bipolar Transistor) according to a second embodiment, and FIG. 3 is a top plan view of the IGBT shown in FIG. 2.

The IGBT 40 shown in FIG. 2 includes an n-type base layer (first conductivity type base layer) 41, p-type base layers (second conductivity type base layers) 42 selectively formed at one main surface of the n-type base layer 41, and n-type emitter layers (first conductivity type emitter layers) 43 selectively formed at the surfaces of the p-type base layers 42 opposite to the n-type base layer 41. Then, trenches are formed so as to reach the n-type base layer 41 through the n-type emitter layers 43 and the p-type base layers 42 so that the gate insulating films 44 and the gate electrodes 45 are formed in the trenches. Then, an emitter electrode 46 is formed above the gate electrodes 45 so as to be electrically connected with the p-type base layers 42 and the n-type emitter layers 43.

Then, an n-type buffer layer (first conductivity buffer layer) 47 is formed on the other main surface of the n-type base layer 41, and a p-type collector layer (second conductivity type collector layer) 48 is formed on the main surface of n-type buffer layer 47 opposite to the n-type base layer 11, and a collector electrode 49 is formed so as to be electrically connected with the p-type collector layer 48.

The n-type base layer 41, the p-type base layers 42, the n-type emitter layers 43, the gate electrodes 45 (and the gate insulating films 44), the emitter electrode 46, the n-type buffer layer 47, the p-type collector layer 48 and the collector electrode 49 function an effective unit 50 to realize the inherent transistor operation of the IGBT 40. The effective unit 50 can exhibit the inherent IGBT function (e.g., flowing a main current of the IGBT) and is located at the center of the chip constituting the IGBT 10.

On the other hand, a plurality of guard rings 55 are provided at the one main surface of the n-type base layer 11 in the vicinity of the p-type base layers 42 and located outward from the p-type base layers 42. The guard rings 55 are formed by selectively injecting p-type impurities into the n-type base layer 41, for example and function as an electric field relaxing structure.

In this embodiment, the p-type collector layer 48 and the collector layer 40 are formed so as to be elongated from the effective unit 50 below the guard rings 55. The n-type base layer 41, the n-type buffer layer 47, the p-type collector layer 48, the collector electrode 49 and the guard rings 50 constitute an electric field relaxing unit 60 of the IGBT 40. The electric field relaxing unit 60 is located at the terminal of the chip constituting the IGBT 40.

An $n^+$ stopper layer 57 is formed at the outermost of the electric field relaxing unit 60 so as to prevent the electric conduction at the edge of the IGBT 40 (chip).

In this embodiment, the gate electrodes 45 are divided into the peripheral gate electrodes 45A and the center gate electrodes 45B. The peripheral gate electrodes 45A are located in the side of the electric field relaxing unit 60. The center electrode 45B are located inside from the peripheral gate electrodes 45A. As shown in FIG. 3, the peripheral gate electrodes 45A and the center gate electrodes 45B are electrically connected with gate electrode pads 71 and 72, respectively, which are provided independently via not shown wirings, and then, controlled by the respective different control signals from a controller 70.

Concretely, a predetermined control signal is applied to the gate electrode pad 72 via the resistance R and another predetermined control signal is directly applied to the gate electrode pad 71. Therefore, a predetermined control signal is applied to the gate electrode pad 72 later than another predetermined control signal is applied to the gate electrode pad 71. In the case that the IGBT 40 is switched off, first, off-state control signal is applied to the peripheral gate electrodes 45A and then, to the center gate transistors 45B. As a result, when the IGBT 40 is switched off, first, the electric field relaxing unit 60 becomes off-state and then, the effective unit 50 functioning as the inherent IGBT becomes off-state.

As a result, when the effective unit 50 functioning as the IGBT becomes off-state, the electric field relaxing unit 60 already becomes off-state so that the carriers stored in the unit 60 are extinguished through recombination. Therefore, the amount of carriers in the electric field relaxing unit 60 becomes smaller than the amount of carriers in the effective unit 50 in the same manner as in the first embodiment. Therefore, since the effective unit 50 has a large amount of carriers, the depletion layer is formed only at a narrower area of the effective unit 50. In the electric field relaxing unit 60 of the IGBT 40, the depletion layer can not be almost formed or formed to be laterally elongated. In this embodiment, therefore, when the IGBT 40 is off-state, the voltage waveform and current waveform generated from the IGBT 40 are not oscillated because the depletion layer is not contacted with the n-type buffer layer 47. As a result, the electromagnetic noises originated from the oscillation of the voltage waveform and the current waveform can be prevented.

Moreover, since the formation area of the depletion layer is limited to a narrower area at both of the effective unit 50 and the electric field relaxing unit 60 of the IGBT 40, the thickness of the n-type base layer 41 can be reduced to 200 μm or less, for example. In the case that the IGBT 40 is switched on so that a current is flowed vertically to the emitter electrode 46 from the collector electrode 49, the electric power lose relating to the current flow can be reduced. Namely, the electric power loss at the on-state of the IGBT 40 can be reduced.

In this embodiment, since the electric field relaxing unit 60 of the IGBT 40 has an extremely small amount of carriers, the intensity of the electric field generated at the electric field relaxing unit 60 becomes small. As a result, the intensity of the electric field generated at the electric field relaxing unit 60 is unlikely to become larger than the critical intensity of the electric field to cause the avalanche phenomenon even though the critical intensity of the electric field for the avalanche phenomenon is small. Accordingly, in the IGBT 40 of this embodiment, particularly since the avalanche phenomenon at the electric field relaxing unit 60 can be prevented effectively so that the electric power loss accompanied by the avalanche phenomenon, that is, the electric power loss at the non-conduction state of the off-state of the IGBT 40 can be prevented.

In other words, according to the IGBT 40 of this embodiment, the intended vertical semiconductor device can be provided so that the electric power loss at the conduction state of the on-state of the IGBT 40 can be prevented while the electric power loss at the non-conduction of the off-state of the IGBT 40 can be also prevented and so that the electromagnetic noises can be removed effectively.

In this embodiment, a predetermined control signal is directly applied to the gate electrode pad 71 to which the peripheral gate electrodes 45A are electrically connected from the controller 70 via no resistance, but may be via a prescribed resistance only if the resistance to be connected with the gate electrode pad 72 is set larger than the resistance to be connected with the gate electrode pad 71. In this case, a predetermined control signal is applied to the gate electrode pad 72, that is, the center gate electrodes 45B later than another predetermined control signal is applied to the gate electrode pad 71, that is, the peripheral gate electrodes 45A. In the case that the IGBT 40 is switched off, first, off-state control signal is applied to the peripheral gate electrodes 45A and then, to the center gate transistors 45B. Therefore, the above-described function/effect can be exhibited.

The peripheral gate electrodes 45A can be located in the region defined by the distance corresponding to the thickness "t" of the n-type base layer 41 from the outermost 45C of the electric field relaxing unit 60. In this case, the above-described function/effect can be exhibited conspicuously.

Third Embodiment

Figure 4:
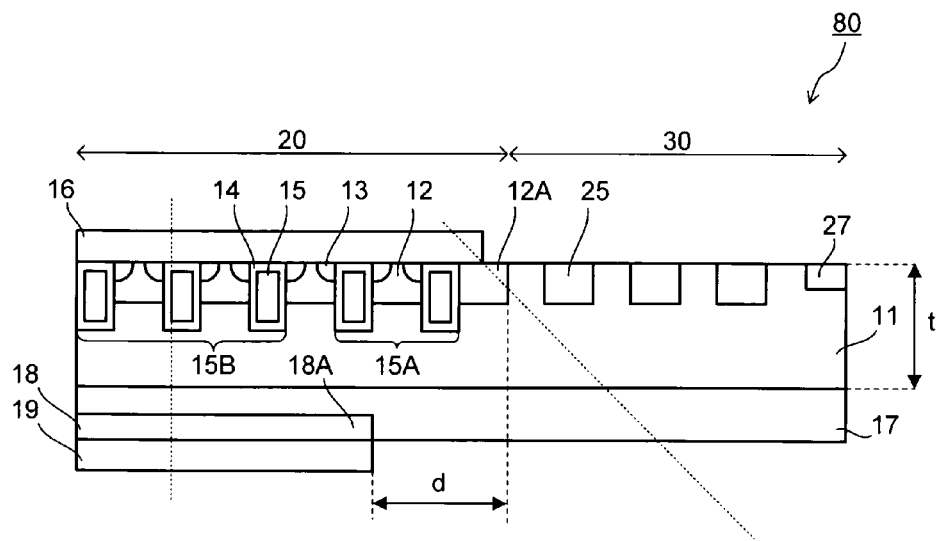
FIG. 4 is across sectional view showing an IGBT according to third embodiment.

FIG. 4 is a cross sectional view showing a vertical IGBT (Insulated Gate Bipolar Transistor) according to third embodiment.

This embodiment is a combination of the first embodiment and the second embodiment. As shown in FIG. 4, the IGBT 80 shown in FIG. 4 is based on the IGBT 10 in the first embodiment so that the gate electrodes 15 of the IGBT 10 are divided into the peripheral electrodes 15A and the center electrodes 15B and a predetermined control signal is applied to the center gate electrodes 15B later that another predetermined control signal is applied to the peripheral electrodes 15A in the same manner as the IGBT 40 of the second embodiment.

Therefore, the IGBT 80 in this embodiment can exhibit the characteristics of both of the IGBT 10 of the first embodiment and the IGBT 40 of the second embodiment. According to the synergy effect of the first embodiment and the second embodiment, therefore, the voltage waveform and current waveform generated from the IGBT 80 are not oscillated more effectively so that the electromagnetic noises originated from the oscillation of the voltage waveform and the current waveform can be prevented more effectively.

In other words, according to the IGBT 80 of this embodiment, the intended vertical semiconductor device can be provided so that the electric power loss at the conduction state of the on-state of the IGBT 80 can be prevented while the electric power loss at the non-conduction of the off-state of the IGBT 80 can be also prevented and so that the electromagnetic noises can be removed effectively.

Although the present invention was described in detail with reference to the above examples, this invention is not limited to the above disclosure and every kind of variation and modification may be made without departing from the scope of the present invention.

In the embodiments, for example, the first conductivity type is set to the n-type and the second conductivity type is set to the p-type, but may be vice versa.

In the embodiment, the trenches are formed at the IGBT in the thickness direction and the gate electrodes are formed so as to embed the trenches, thereby forming a so-called trench type IGBT, but the present invention can be applied to a planer IGBT where the gate electrode is formed on the emitter electrode.

In the embodiment, the electric field relaxing structure is constituted by using the guard rings, but may be by using a resurf structure or the like.

The present invention can be applied to another bipolar element such as a diode.

What is claimed is:

1. A vertical semiconductor device, comprising:
   a first base layer of a first conductivity type;
   second base layers of a second conductivity type selectively formed at one main surface of said first base layer;
   emitter layers of said first conductivity type selectively formed at respective surfaces of said second base layers opposite to said first base layer;
   an electric field relaxing structure selectively formed at said one main surface of said first base layer outside and away from an outermost second base layer of said second base layers;
   gate electrodes to be electrically connected with at least said second base layer via respective gate insulating films;
   an emitter electrode to be electrically connected with said second base layer and said emitter layers;
   a buffer layer of said first conductive type formed on the other main surface of said first base layer;
   a collector layer of said second conductivity type formed at a main surface of said buffer layer opposite to said base layer except a region below said electric field relaxing structure; and
   a collector electrode layer formed on said main surface of said buffer layer so as to be electrically connected with said collector layer,
   wherein an edge of said collector layer in the side of said electric field relaxing structure is located inside from an edge of said base layer in the side of said electric field relaxing structure by a distance equal to or more than a thickness of said first base layer.

2. The semiconductor device as set forth in claim 1, wherein said collector electrode is not formed within said electric field relaxing structure.

3. The semiconductor device as set forth in claim 1, further comprising a stopper layer for preventing electric conduction at an edge of said semiconductor device.

4. The semiconductor device as set forth in claim 1,
wherein said electric field relaxing structure includes a plurality of guard rings.

5. The semiconductor device as set forth in claim 1,
wherein said electric field relaxing structure includes a resurf structure.

6. The semiconductor device as set forth in claim 1, wherein said gate electrodes are divided into peripheral gate electrodes located in the side of said electric field relaxing structure and center gate electrodes located inside from said peripheral gate electrodes so that a high speed control signal is applied to said peripheral electrodes in comparison with said center gate electrodes.

7. The semiconductor device as set forth in claim 6,
wherein said collector electrode is not formed within said electric field relaxing structure.

8. The semiconductor device as set forth in claim 6,
wherein an edge of said collector layer in the side of said electric field relaxing structure is located inside from an edge of said base layer in the side of said electric field relaxing structure by a distance equal to or more than a thickness of said first base layer.

9. The semiconductor device as set forth in claim 6,
wherein said peripheral gate electrodes are located in a region defined by a distance corresponding to a thickness of said first base layer from an outermost of said electric field relaxing structure.

10. The semiconductor device as set forth in claim 6,
wherein a resistance value of an external resistance for signal control to be electrically connected with said peripheral gate electrodes is set smaller than a resistance value of an external resistance for signal control to be electrically connected with said center gate electrodes.

11. The semiconductor device as set forth in claim 6, further comprising a stopper layer for preventing electric conduction at an edge of said semiconductor device.

12. The semiconductor device as set forth in claim 6,
wherein said electric field relaxing structure includes a plurality of guard rings.

13. The semiconductor device as set forth in claim 6,
wherein said electric field relaxing structure includes a resurf structure.

\* \* \* \* \*